United States Patent
Ito et al.

(10) Patent No.: US 9,711,380 B2
(45) Date of Patent: Jul. 18, 2017

(54) LIQUID PROCESSING APPARATUS, LIQUID PROCESSING METHOD AND STORAGE MEDIUM

(75) Inventors: Norihiro Ito, Koshi (JP); Takashi Nagai, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 993 days.

(21) Appl. No.: 13/593,666

(22) Filed: Aug. 24, 2012

(65) Prior Publication Data
US 2013/0048609 A1    Feb. 28, 2013

(30) Foreign Application Priority Data
Aug. 25, 2011 (JP) .................... 2011-183996

(51) Int. Cl.
| | |
|---|---|
| H01L 21/67 | (2006.01) |
| H01L 21/02 | (2006.01) |
| B08B 3/02 | (2006.01) |
| B08B 3/08 | (2006.01) |

(52) U.S. Cl.
CPC ........ H01L 21/67017 (2013.01); B08B 3/022 (2013.01); B08B 3/08 (2013.01); H01L 21/02057 (2013.01); H01L 21/67051 (2013.01); H01L 21/67109 (2013.01)

(58) Field of Classification Search
None
See application file for complete search history.

(56) References Cited

U.S. PATENT DOCUMENTS 6,327,718 B1 * 12/2001 Ono .................... E03D 9/08
4/420.2

2011/0220157 A1 * 9/2011 Taira ................ H01L 21/02041
134/36

FOREIGN PATENT DOCUMENTS

| JP | 2003-017453 A | 1/2003 |
| JP | 2003017453 A * | 1/2003 |
| JP | 2007-123393 A | 5/2007 |
| JP | 2007123393 A * | 5/2007 |
| JP | 2009-272548 A | 11/2009 |

(Continued)

OTHER PUBLICATIONS

English Machine Translation of JP 2010-092921 A.*

(Continued)

*Primary Examiner* — Nicole Blan
(74) *Attorney, Agent, or Firm* — Abelman, Frayne & Schwab (57) ABSTRACT

Disclosed are a liquid processing apparatus and a liquid processing method. The liquid processing apparatus includes an ejection port ejecting a first liquid to a wafer, a first liquid supply mechanism supplying sulphuric acid to the ejection port, and a second liquid supply mechanism supplying hydrogen peroxide solution to the ejection port. The first liquid supply mechanism includes a first temperature adjustment mechanism maintaining the first liquid heated to a first temperature, a second temperature adjustment mechanism connected to the first temperature adjustment mechanism, and an ejection line connecting the second temperature adjustment mechanism with the ejection port. The second temperature adjustment mechanism includes a second circulation line and a second heater. The ejection line connects the second circulation line through a switching valve at a location further downstream than the second heater.

14 Claims, 5 Drawing Sheets

(56) References Cited

FOREIGN PATENT DOCUMENTS

| | | | |
|---|---|---|---|
| JP | 2009272548 A | * | 11/2009 |
| JP | 2010-092921 A | | 4/2010 |
| JP | 2010092921 A | * | 4/2010 |
| JP | 2011-35128 A | | 2/2011 |
| JP | 2012-138620 A | | 7/2012 |

OTHER PUBLICATIONS

English Machine Translation of JP 2003-017453 A.*
English Machine Translation of JP 2007-123393 A.*
English Machine Translation of JP 2009-272548 A.*

* cited by examiner

LIQUID PROCESSING APPARATUS, LIQUID PROCESSING METHOD AND STORAGE MEDIUM

CROSS-REFERENCE TO RELATED APPLICATIONS

This application is based on and claims priority from Japanese Patent Application No. 2011-183996, filed on Aug. 25, 2011, with the Japanese Patent Office, the disclosure of which is incorporated herein in its entirety by reference.

TECHNICAL FIELD

The present disclosure relates to a liquid processing apparatus and a liquid processing method for performing a substrate liquid processing using a temperature adjusted liquid.

BACKGROUND

In the related art, various types of liquid processing apparatuses have been known which perform a liquid processing such as a cleaning, an etching, a plating and a developing of a substrate (hereinafter, also referred to as "wafer") by supplying a process liquid to a front surface or a back surface of the substrate while holding the substrate in a horizontal state. Further, there has been proposed a technique in which the temperature of the process liquid supplied to wafer W is increased to activate the reaction by the process liquid to make the liquid processing to be easily progressed. See, for example, Japanese Patent Application Laid-Open Publication No. 2007-123393 which discloses a technique in which a process liquid supplied to wafer W is heated while being circulated in the vicinity of a tank which stores the process liquid.

SUMMARY

An exemplary embodiment of the present disclosure provides a liquid processing apparatus which performs a liquid processing on a substrate using a temperature adjusted liquid, which includes: a processing chamber provided with a substrate holder holding a substrate, an ejection port to eject a first liquid to the substrate held in the substrate holder, and a first liquid supply mechanism configured to supply the first liquid to the ejection port. In particular, the first liquid supply mechanism includes a first temperature adjustment mechanism that maintains the first liquid heated to a first temperature, a second temperature adjustment mechanism connected to the first temperature adjustment mechanism, and an ejection line that connects the second temperature adjustment mechanism with the ejection port. Moreover, the first temperature adjustment mechanism includes a supply tank that stores the first liquid, a first circulation line connected to the supply tank to circulate the first liquid, a first heater that heats the first liquid to a first temperature, and a pump installed on the first circulation line. Further, the second temperature adjustment mechanism includes a second circulation line that branches from the first circulation line and returns to the first temperature adjustment mechanism, and a second heater installed on the second circulation line to heat the first liquid to a supply temperature higher than the first temperature. Still further, the ejection line connects with the second circulation line through a switching valve at a location further downstream than the second heater.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

A reaction by a process liquid is generally activated as the temperature increases. Meanwhile, when the temperature of the process liquid is increased, a high temperature process liquid passes through a supply tank or circulation line of a liquid processing apparatus. However, some of the elements, such as a pump, installed on the circulation line do not have a heat resistance or a chemical resistance to the high temperature process liquid.

The present disclosure has been made in an effort to provide a liquid processing apparatus and a liquid processing method that can provide a high temperature process liquid while sustaining a heat resistance and a chemical resistance to the high temperature process liquid.

A first exemplary embodiment of the present disclosure provides a liquid processing apparatus which performs a liquid processing on a substrate using a temperature adjusted liquid, which includes: a processing chamber provided with a substrate holder holding a substrate, an ejection port to eject a first liquid to the substrate held in the substrate holder, and a first liquid supply mechanism configured to supply the first liquid to the ejection port. In particular, the first liquid supply mechanism includes a first temperature adjustment mechanism that maintains the first liquid heated to a first temperature, a second temperature adjustment mechanism connected to the first temperature adjustment mechanism, and an ejection line that connects the second temperature adjustment mechanism with the ejection port. Moreover, the first temperature adjustment mechanism includes a supply tank that stores the first liquid, a first circulation line connected to the supply tank to circulate the first liquid, a first heater that heats the first liquid to a first temperature, and a pump installed on the first circulation line. Further, the second temperature adjustment mechanism includes a second circulation line that branches from the first circulation line and returns to the first temperature adjustment mechanism, and a second heater installed on the second circulation line to heat the first liquid to a supply temperature higher than the first temperature. Still further, the ejection line connects with the second circulation line through a switching valve at a location further downstream than the second heater.

In the liquid processing apparatus, when the first liquid is not supplied to the ejection port from the second temperature adjustment mechanism of the first liquid supply mechanism, the first liquid is supplied to the supply tank by the switching valve, and when the first liquid is supplied to the ejection port from the second temperature adjustment mechanism of the first liquid supply mechanism, the first liquid is supplied to the ejection line from the second circulation line by the switching valve.

Further, a plurality of the second temperature adjustment mechanisms are branched from a single first liquid supply mechanism, and each of the second temperature adjustment mechanisms includes an ejection line connected to an ejection port.

In particular, a flow rate of the first liquid returned to the supply tank from the first temperature adjustment mechanism through the first circulation line is larger than that returned to the supply tank from the second temperature adjustment mechanism through the second circulation line.

In the liquid processing apparatus, when the first liquid is not supplied to the ejection port from the second temperature adjustment mechanism of the first liquid supply mechanism, the second heater of the second temperature adjustment mechanism is stopped.

Further, when the first liquid is not supplied to the ejection port from the second temperature adjustment mechanism of the first liquid supply mechanism, the second heater of the second temperature adjustment mechanism heats the first liquid to a predetermined second temperature between the first temperature and the supply temperature.

Moreover, the second temperature adjustment mechanism includes a flow rate sensor measuring the flow rate of the first liquid and a stop unit stopping the second heater when the flow rate measured by the flow rate sensor becomes less than a predetermined lower limit of flow rate.

The liquid processing apparatus further includes a second liquid supply mechanism connected between the switching valve and the ejection port to supply a second liquid to the ejection port. In the liquid processing apparatus, the ejection port is included in an ejection mechanism to allow the ejection mechanism to mix the first liquid supplied from the first liquid supply mechanism with the second liquid supplied from the second liquid supply mechanism and heat the mixed liquid to a third temperature higher than the supply temperature to be ejected toward the substrate.

A second exemplary embodiment of the present disclosure provides a liquid processing method in which a substrate liquid processing is performed using a temperature adjusted liquid, which includes: holding a substrate by a substrate holder provided in a processing chamber; supplying a first liquid from a first liquid supply mechanism to an ejection port; and ejecting the first liquid to the substrate held in the substrate holder from the ejection port. In particular, the first liquid supply mechanism includes a first temperature adjustment mechanism having a first circulation line that circulates the first liquid heated to a first temperature, a second temperature adjustment mechanism having a second circulation line that branches from the first circulation line and returns to the first temperature adjustment mechanism, and an ejection line connects the second circulation line with the ejection port through a switching valve. Moreover, when the first liquid is supplied to the ejection port, the first liquid heated to the supply temperature higher than the first temperature by the second temperature adjustment mechanism is supplied to the ejection port through the switching valve and the ejection line, and when the first liquid is not supplied to the ejection port, the first liquid is returned to the first temperature adjustment mechanism through the second circulation line and the switching valve of the second temperature adjustment mechanism.

In the liquid processing method, a flow rate of the first liquid circulating in the first circulation line of the first temperature adjustment mechanism is larger than that returned to the first temperature adjustment mechanism from the second temperature adjustment mechanism through the second circulation line. Further, the first liquid flowing on the first temperature adjustment mechanism is supplied to a plurality of the second temperature adjustment mechanisms.

In the liquid processing method, when the first liquid is not supplied to the ejection mechanism from the second temperature adjustment mechanism of the first liquid supply mechanism, the first liquid is not heated by the second temperature adjustment mechanism and returned to the first temperature adjustment mechanism through the second circulation line and the switching valve.

Moreover, when the first liquid is not supplied to the ejection port from the second temperature adjustment mechanism of the first liquid supply mechanism, the first liquid is heated first to a predetermined second temperature between the first temperature and the supply temperature by the second temperature adjustment mechanism at a location further upstream than the switching valve, and then the first liquid is returned to the first temperature adjustment mechanism through the second circulation line and the switching valve.

Further, when the flow rate of the first liquid becomes less than a predetermined lower limit of the flow rate, the second temperature adjustment mechanism does not heat the first liquid.

In particular, in an ejection mechanism having the ejection port, the first liquid supplied from the first liquid supply mechanism is mixed with a second liquid supplied from a second liquid supply mechanism and the mixed liquid is heated to a third temperature higher than the supply temperature to be ejected toward the substrate.

A third exemplary embodiment of the present disclosure provides a computer-readable storage medium having stored a program executed by a control mechanism for controlling a liquid processing apparatus therein, in which the program, when executed by a control mechanism, causes the liquid processing apparatus to perform the liquid processing method.

According to the liquid processing apparatus and liquid processing method of the present disclosure, it is possible to supply a process liquid having a high temperature while sustaining heat resistance and chemical resistance to the high temperature process liquid.

Hereinafter, an exemplary embodiment of the present disclosure will be described with reference to FIG. 1 to FIG. 6. In the accompanying drawings, elements are exaggeratedly depicted in an appropriate scale and aspect ratio than their actual sizes, for ease of understanding and convenience of illustration.

In the following embodiments, the present disclosure is described with respect to an example applied to a cleaning processing of a semiconductor wafer. In the cleaning processing, a processing using SPM liquid acquired by mixing sulfuric acid (first liquid) with hydrogen peroxide solution (second liquid), a processing using rinsing liquid and a processing using liquid for drying are performed. The sulfuric acid constituting the SPM liquid is supplied while being adjusted to have a predetermined temperature by the liquid processing apparatus according to the embodiment of the present disclosure and mixed with the hydrogen peroxide solution. However, the present disclosure is not limited to an application to a temperature adjustment of sulfuric acid for the cleaning processing, but may be applied to the temperature adjustment of various kinds of liquid. Further, the present disclosure is not limited to the cleaning processing, but may be applied to various kinds of the liquid processings such as etching, plating and developing.

Liquid Processing Apparatus

Figure 1:
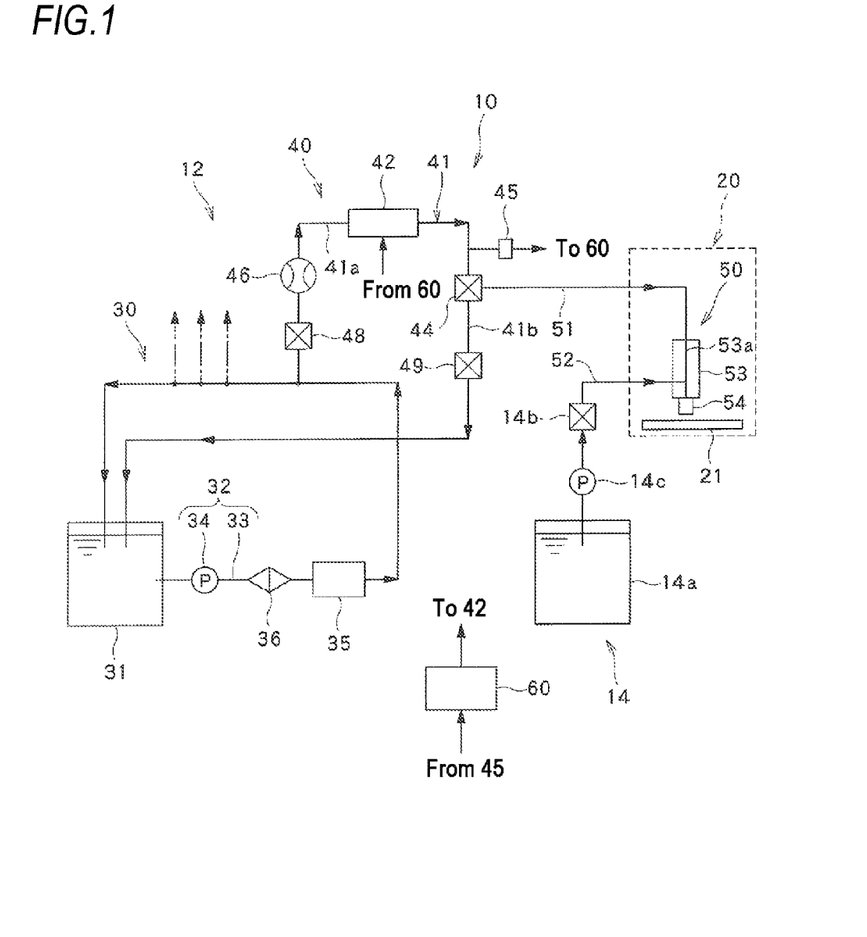
FIG. 1 is a view schematically illustrating an overall configuration of a liquid processing apparatus according to an exemplary embodiment of the present disclosure.
Figure 2:
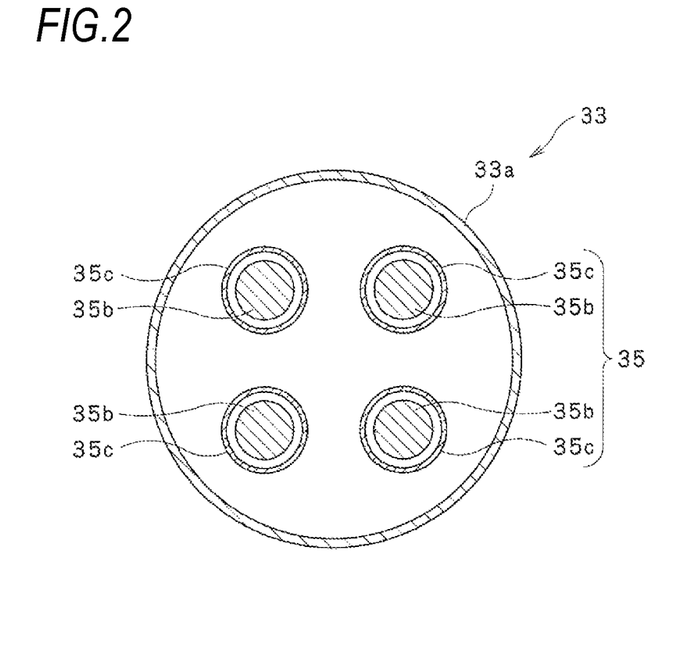
FIG. 2 is a cross-sectional view illustrating a first heater of a first temperature adjustment mechanism of the liquid processing apparatus illustrated in FIG. 1.

First, a liquid processing apparatus 10 of the exemplary embodiment of the present disclosure will be described with reference to FIG. 1 and FIG. 2 in its entirety. As illustrated in FIG. 1, liquid processing apparatus 10 includes a processing chamber 20 provided with a wafer 21, an ejection mechanism 50 ejecting the SPM liquid to wafer 21, a first liquid supply mechanism 12 supplying the sulfuric acid (first liquid) to ejection mechanism 50, a second liquid supply mechanism 14 supplying hydrogen peroxide solution (second liquid) to ejection mechanism 50, and a control mechanism 60 controlling first liquid supply mechanism 12 and second liquid supply mechanism 14. First liquid supply mechanism 12 includes, as illustrated in FIG. 1, a first temperature adjustment mechanism 30, a second temperature adjustment mechanism 40 connected to first temperature adjustment mechanism 30, and a first ejection line 51 connecting second temperature adjustment mechanism 40 with ejection mechanism 50. As will be described below, the sulfuric acid of first liquid supply mechanism 12 is supplied to first ejection line 51 while being heated to a temperature equal to or higher than a predetermined supply temperature by first temperature adjustment mechanism 30 and second temperature adjustment mechanism 40. Second liquid supply mechanism 14, as illustrated in FIG. 1, includes a supply tank 14a storing the hydrogen peroxide solution, a second ejection line 52 connecting supply tank 14a with ejection mechanism 50, a pump 14c installed on second ejection line 52, and a valve 14b adjusting a flow rate of hydrogen peroxide solution sent to ejection mechanism 50 through second ejection line 52.

As illustrated in FIG. 1, ejection mechanism 50 includes an inner pipe 53a connected to first ejection line 51 and second ejection line 52, a nozzle 53 including an ejection port 54 ejecting the SPM liquid to wafer 21. As illustrated in FIG. 1, sulfuric acid supplied through first ejection line 51 and the hydrogen peroxide solution supplied through second ejection line 52 are mixed with each other in inner pope 53a provided within nozzle 53 to become SPM liquid. In this case, heat generated by mixing of the sulfuric acid with the hydrogen peroxide solution causes the temperature of SPM liquid to be raised to a higher temperature (an ejection temperature) from the temperature of sulfuric acid heated by second temperature adjustment mechanism 40. The SPM liquid of which temperature having been heated up to the ejection temperature is ejected from ejection port 54 of nozzle 53 to wafer 21.

First Temperature Adjustment Mechanism

Next, a first temperature adjustment mechanism 30 of first liquid supply mechanism 12 will be described. As illustrated in FIG. 1, first temperature adjustment mechanism 30 includes a supply tank 31 storing sulfuric acid, a tank circulation unit 32 connected to supply tank 31 circulating the sulfuric acid, a first heater 35 installed in tank circulation unit 32 and heating the sulfuric acid, and a filter 36 inserted in tank circulation unit 32. Tank circulation unit 32 includes a first circulation line 33 of which one end and the other end is connected to supply tank 31, respectively, and a pump 34 inserted in first circulation line 33. First heater 35 is controlled to heat sulfuric acid contained in first circulation line 33 to a predetermined first temperature. In this case, the sulfuric acid sent to first circulation line 33 from supply tank 31 is heated to the first temperature by first heater 35. Thereafter, a portion of the heated sulfuric acid is supplied to second temperature adjustment mechanism 40, and a remaining portion thereof is returned to supply tank 31 through first circulation line 33. In FIG. 1, an example in which first heater 35 is attached to first circulation line 33 is illustrated, but, attachment of first heater 35 is not limited thereto, and first heater 35 may be attached to supply tank 31. In this case, the sulfuric acid is heated to the first temperature in supply tank 31 by first heater 35.

Heat resistance and chemical resistance that resist the sulfuric acid heated to the first temperature are required for each element, such as for example, pump 34 and filter 36, installed in first circulation line 33.

A flow rate of the sulfuric acid returned to supply tank 31 through first circulation line 33 among the sulfuric acid sent to first circulation line 33 from supply tank 31 is larger than that of the sulfuric acid supplied to second temperature adjustment mechanism 40. As a result, the temperatures of the sulfuric acid contained in supply tank 31 and first circulation line 33 in first temperature adjustment mechanism 30 are always kept stable at a temperature near the first temperature. The specific value of the first temperature is not particularly limited, but in this case, specified as 170° C.

[First Heater]

Next, first heater 35 will be described. FIG. 2 is a longitudinal cross-sectional view illustrating first heater 35 installed within first circulation line 33. First circulation line 33 is configured by a first circulation pipe 33a which is made of, for example, quartz. As illustrated in FIG. 2, first heater 35 is disposed within first circulation pipe 33a and includes a plurality of heating mechanisms including a heating part, for example, halogen heater 35b for heating the sulfuric acid and a cladding pipe 35c surrounding halogen heater 35b. As a result, it is possible to supply a sufficient heat to the sulfuric acid contained in first circulation pipe 33a and uniformly heat the sulfuric acid contained in first circulation pipe 33a irrespective of location by installing the plurality of heating mechanisms in first circulation pipe 33a.

Second Temperature Adjustment Mechanism

Next, second temperature adjustment mechanism 40 of first liquid supply mechanism 12 will be described. As illustrated in FIG. 1, second temperature adjustment mechanism 40 includes a second circulation line 41 branching from first circulation line 33 of first temperature adjustment mechanism 30 and returning to first temperature adjustment mechanism 30, second heater 42 installed in second circulation line 41 and capable of heating the sulfuric acid, a switching valve 44 installed at a location further downstream than second heater 42, inserted in second circulation line 41 and connected with first ejection line 51, and a temperature sensor 45 installed between second heater 42 and switching valve 44 and measuring the temperature of the sulfuric acid contained in second circulation line 41. Second circulation line 41 is constituted with a supply line 41a connected to first circulation line 33 of first temperature adjustment mechanism 30 and provided with second heater 42, and a return line 41b connected to supply line 41a through switching valve 44 and connected to first temperature adjustment mechanism 30. Switching valve 44 is configured to allow a passage between second circulation line 41 and first ejection line 51 to be blocked or communicated depending on control by control mechanism 60. The specific configuration of switching valve 44 will be described below.

As illustrated in FIG. 1, second temperature adjustment mechanism 40 further includes a valve 48 installed at upstream side of second heater 42 of second circulation line 41 and a valve 49 installed at downstream side of switching valve 44. Valve 48 is configured to adjust the flow rate of the sulfuric acid supplied to second temperature adjustment mechanism 40 from first temperature adjustment mechanism 30. The flow rate of the sulfuric acid is adjusted, for example, based on information from a flow rate sensor 46 installed in second circulation line 41 and measuring the flow rate of sulfuric acid. Valve 49 is adapted to be opened and closed depending on a supply mode and a circulation mode, which will be described below.

As will be described below, second heater 42 is controlled to heat the sulfuric acid to a temperature at least higher than a predetermined supply temperature during the supply mode where the sulfuric acid of second temperature adjustment mechanism 40 is supplied to ejection mechanism 50. Herein, the supply temperature refers to a temperature at the time of mixing of the sulfuric acid with the hydrogen peroxide solution, and is set to a temperature of, for example, 200° C., which is higher than the above-described first temperature. Therefore, those elements, for example, such as, switching valve 44, temperature sensor 45 and valve 49 disposed at downstream side of second heater 42 among each element of second temperature adjustment mechanism 40 are configured to have heat resistance (e.g., heat resistance of 200° C.) and chemical resistance resisting the sulfuric acid heated to at least the supply temperature or more. Meanwhile, the element, such as for example, valve 48 disposed at upstream side of second heater 42 among each element of second temperature adjustment mechanism 40 does not come into contact with the sulfuric acid heated by second heater 42. Therefore, the heat resistance and chemical resistance resisting the sulfuric acid heated to the supply temperature are not required for valve 48. Accordingly, valve 48 just needs to have the heat resistance (e.g., heat resistance of 170° C.) and chemical resistance resisting the sulfuric acid heated to at least the first temperature.

The temperature of the sulfuric acid returning to supply tank 31 of first temperature adjustment mechanism 30 through second circulation line 41 is decreased from the supply temperature to the first temperature or less, or a temperature slightly higher than the first temperature during the sulfuric acid flows in second circulation line 41. Meanwhile, the sulfuric acid returning to supply tank 31 through first circulation line 33 is decreased to a temperature lower than the first temperature during circulation, and then returns to supply tank 31. The flow rate of the first liquid returning to supply tank 31 through first circulation line 33 is larger than that of the first liquid returning to supply tank 31 through second circulation line 41. The sulfuric acid returned through first circulation line 33 and that returned through second circulation line 41 are mixed with each other to be stored in supply tank 31. In this case, even when the temperature of the sulfuric acid returned through second circulation line 41 was slightly higher than the first temperature, the temperature of the sulfuric acid contained in supply tank 31 becomes equal to or lower than by being mixed with the sulfuric acid returned through first circulation line 33. Therefore, the temperature of the sulfuric acid returned to first temperature adjustment mechanism 30 becomes the first temperature or less, so that the sulfuric acid having a higher temperature than the first temperature does not flow in first temperature adjustment mechanism 30. Therefore, each element of first temperature adjustment mechanism 30, such as for example, pump 34 and filter 36 may be designed in consideration of heat resistance and chemical resistance resisting the sulfuric acid having the first temperature other than the supply temperature. As a result, it is possible to reduce the cost for each element of first temperature adjustment mechanism 30, as compared with a case where each element of first temperature adjustment mechanism 30 needs to have the heat resistance and chemical resistance to resist the sulfuric acid having the supply temperature.

[Second Heater]

Figure 3:
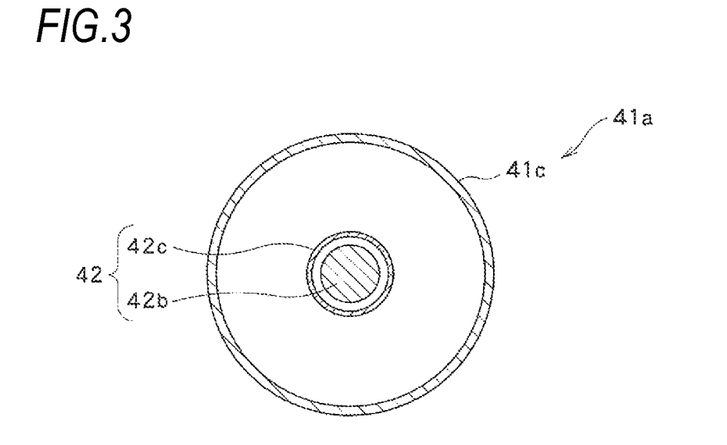
FIG. 3 is a cross-sectional view illustrating a second heater of a second temperature adjustment mechanism of the liquid processing apparatus illustrated in FIG. 1.

Next, second heater 42 will be described. FIG. 3 is a longitudinal cross-sectional view illustrating second heater 42 installed in supply line 41a of second circulation line 41. Supply line 41a is configured by a supplying pipe 41c which is made of, for example, quartz. As illustrated in FIG. 3, second heater 42 is installed in supplying pipe 41c, and includes a heating mechanism, for example, a halogen heater 42b for heating the sulfuric acid, and a cladding pipe 42c surrounding halogen heater 42b.

[Switching Valve]

Figure 4:
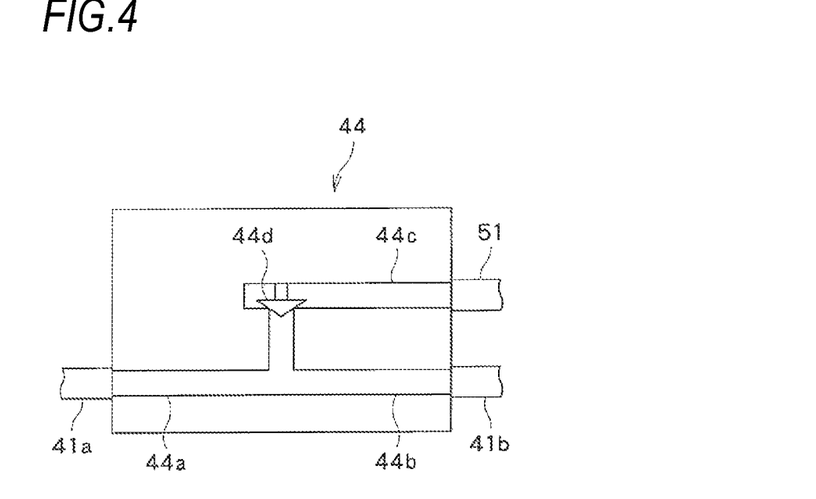
FIG. 4 is a view schematically illustrating a switching valve of the second temperature adjustment mechanism of the liquid processing apparatus illustrated in FIG. 1.

Next, switching valve 44 will be described. FIG. 4 is a view schematically illustrating switching valve 44. As illustrated in FIG. 4, switching valve 44 includes a first line 44a connected to supply line 41a of second circulation line 41 of second temperature adjustment mechanism 40, a second line 44b connected to return line 41b of second circulation line 41 of second temperature adjustment mechanism 40, and a third line 44c connected to first ejection line 51 of ejection mechanism 50. First line 44a and second line 44b, as illustrated in FIG. 4, are configured to allow a passage between supply line 41a and return line 41b of second circulation line 41 to be communicated at all times.

As illustrated in FIG. 4, switching valve 44 further includes a driven member 44d disposed in third line 44c. Driven member 44d is movable between a communication position where the sulfuric acid can flow in third line 44c and a block position where the flow of the sulfuric acid in third line 44c is blocked, depending on the control by control mechanism 60. Therefore, it is possible to appropriately select either a state where a passage between supply line 41a and first ejection line 51 is communicated or a state where a passage between supply line 41a and first ejection line 51 is blocked.

A specific configuration of driven member 44d is not particularly limited, for example, a diaphragm to which an elastic member, such as for example, a spring, is attached is used as driven member 44d. In this case, expansion and contraction of the spring is controlled by introducing air into switching valve 44, and positional control of driven member 44d can be achieved by moving the diaphragm in accordance with the expansion and contraction control.

Processing Chamber

Next, processing chamber 20 will be described with reference to FIGS. 5 and 6, which are a longitudinal cross-sectional view and a plan view illustrating processing chamber 20, respectively.

Figure 5:
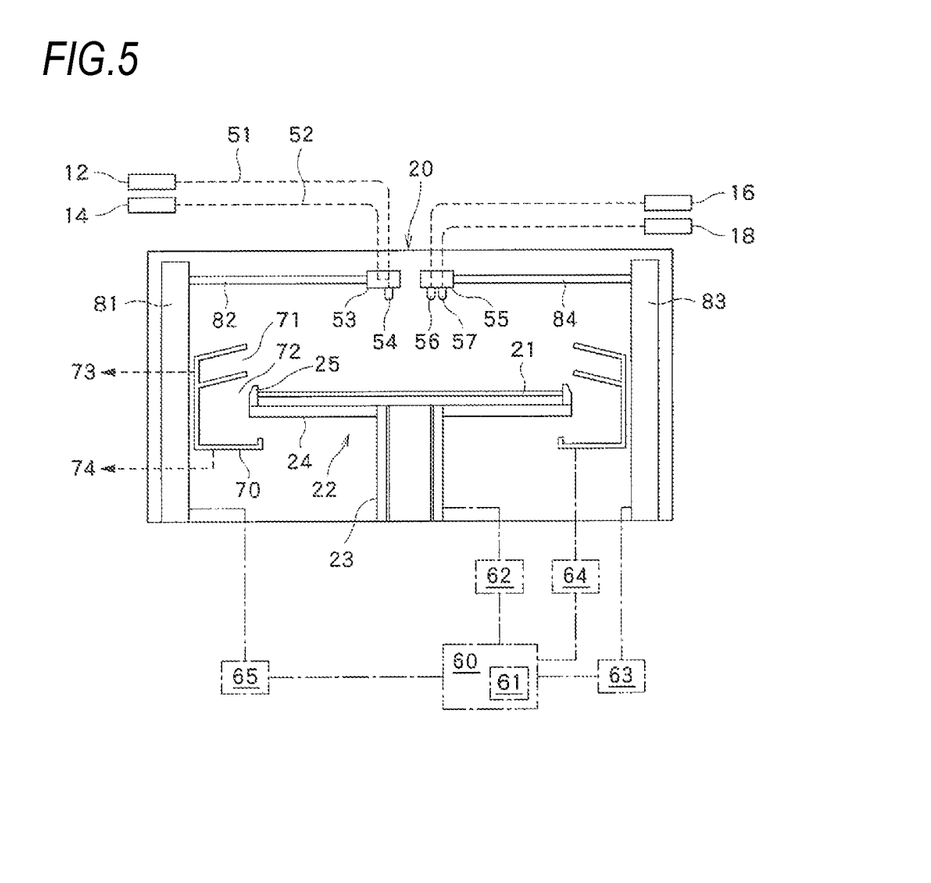
FIG. 5 is a longitudinal cross-sectional view illustrating a processing chamber of the liquid processing apparatus illustrated in FIG. 1.

As illustrated in FIG. 5, processing chamber 20 is provided with substrate holder 22 that holds wafer 21. Substrate holder 22, as illustrated in FIGS. 5 and 6, includes a cylindrical rotation shaft 23 extending in a vertical direction, a turn table 24 attached to an upper end portion of cylindrical rotation shaft 23, a wafer chuck 25 installed at a periphery of an upper surface of turn table 24 to support wafer 21, and a rotation mechanism 62 rotating cylindrical rotation shaft 23. Rotation mechanism 62 is controlled by control mechanism 60. When rotation shaft 23 is rotated by rotation mechanism 62, wafer 21 supported by wafer chuck 25 is rotated simultaneously.

Figure 6:
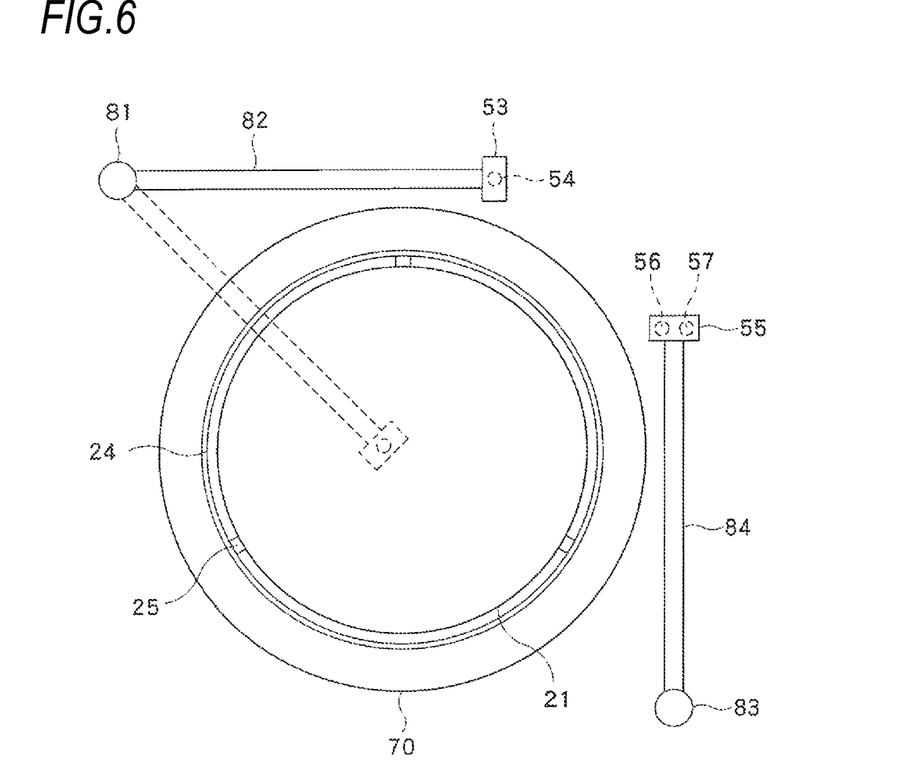
FIG. 6 is a plan view illustrating the processing chamber of the liquid processing apparatus illustrated in FIG. 1.

As illustrated in FIGS. 5 and 6, nozzle 53 including the above-mentioned ejection port 54 for ejecting the SPM liquid toward wafer 21 is disposed in processing chamber 20. Nozzle 53 is attached to a front end of an arm 82 which is extendable and contractable in the vertical direction and fixed to a support shaft 81 rotated by rotation mechanism 65. With this configuration, the SPM liquid can be ejected from a desired height to any location within a surface of wafer 21.

In FIG. 5, first ejection line 51 and second ejection line 52 sending sulphuric acid and hydrogen peroxide solution toward ejection port 54 are depicted as disposed outside arm 82. However, the disposition of first ejection line 51 and second ejection line 52 is not particularly limited, and, for example, first ejection line 51 and second ejection line 52 may be disposed inside arm 82.

As illustrated in FIGS. 5 and 6, a nozzle 55 including ejection ports 56 and 57 which eject additional liquids for cleaning processing to wafer 21 may be further installed in processing chamber 20. The kind of the additional liquids for cleaning processing is not particularly limited, but, in an example illustrated in FIG. 5, ejection port 56 is allocated for ejecting the rinsing liquid, for example, deionized water to wafer 21, and ejection port 57 is allocated for ejecting a liquid, such as for example, isopropyl alcohol (IPA) to wafer 21 for drying. As illustrated in FIG. 5, the rinsing liquid supply mechanism 16 and drying liquid supply mechanism 18 are connected with ejection port 56 and ejection port 57, respectively. As in nozzle 53 described above, nozzle 55 is attached to a front end of an arm 84 which is extendable and contractable in vertical direction and fixed to a support shaft 83 rotated by rotation mechanism 63.

As illustrated in FIG. 5, processing chamber 20 is provided with a cup 70 having a configuration to surround turn table 24 and wafer 21 at lateral sides. Cup 70 includes discharge ports 71 and 72 connected with discharge flow-paths 73 and 74, respectively. Cup 70 is also connected with an elevation mechanism 64 which drives cup 70 in the vertical direction.

As will be described below, each liquid for the cleaning processing scattered from wafer 21 is discharged from discharge flow-paths 73 and 74 through discharge ports 71 and 72, respectively. The correspondence of each liquid with each discharge port 71 and 72 is not particularly limited, but, for example, discharge port 71 and discharge flow-path 73 may be allocated to discharge SPM liquid while discharge port 72 and discharge flow-paths 74 are allocated to discharge deionized water and IPA.

Liquid processing apparatus 10 as described above is driven and controlled by control mechanism 60 according to various kinds of programs recorded on a storage medium 61 installed in control mechanism 60, so that various kinds of processings are performed on substrate 21. Herein, storage medium 61 stores various kinds of set data or various kinds of programs such as a plating program, which will be described below. A known memory such as a computer readable ROM or RAM, or a known disk type storage medium, such as a hard disk, CD-ROM, DVD-ROM or a flexible disk may be used as storage medium 61.

Next, an operation of liquid processing apparatus 10 having the above-mentioned configuration will be described. Herein, each operation of liquid processing apparatus 10 in a supply mode and in a circulation mode will be described. The supply mode refers to a mode at which the sulfuric acid is supplied to ejection mechanism 50 from second temperature adjustment mechanism 40 of first liquid supply mechanism 12, while the circulation mode refers to a mode at which the sulfuric acid of second temperature adjustment mechanism 40 is returned to first temperature adjustment mechanism 30 without supplying the sulfuric acid to ejection mechanism 50 from second temperature adjustment mechanism 40 of first liquid supply mechanism 12.

Circulation Mode

First, an operation of liquid processing apparatus 10 in the circulation mode will be described.

[Operation of First Temperature Adjustment Mechanism]

An operation of first temperature adjustment mechanism 30 of first liquid supply mechanism 12 will be described. First, control mechanism 60 drives pump 34 of first temperature adjustment mechanism 30. By doing this, the sulfuric acid stored in supply tank 31 is circulated in first circulation line 33. The flow rate of the sulfuric acid circulated in first circulation line 33 is not particularly limited, but, for example, specified as 20 liters per minute.

Control mechanism 60 activates first heater 35 of first temperature adjustment mechanism 30 to heat the sulfuric acid circulated in first circulation line 33 to the first temperature. A specific value of the first temperature is not particularly limited, but, for example, the first temperature is set to 170° C., as described above.

[Operation of Second Temperature Adjustment Mechanism]

An operation of second temperature adjustment mechanism 40 of first liquid supply mechanism 12 will be described. First, control mechanism 60 opens valve 48 so that a portion of the sulfuric acid being circulated is supplied from first circulation line 33 of first temperature adjustment mechanism 30 to second temperature adjustment mechanism 40. By doing this, the sulfuric acid of which the temperature is adjusted to the first temperature is supplied to second circulation line 41 of second temperature adjustment mechanism 40. The flow rate of the sulfuric acid supplied to second temperature adjustment mechanism 40 is not particularly limited, but, for example, may be specified as 1(one) liter per minute.

Control mechanism 60 activates second heater 42 of second temperature adjustment mechanism 40 to heat the sulfuric acid supplied to second circulation line 41 further to the second temperature. A specific value of the second temperature is not particularly limited as long as the second temperature is higher than the first temperature and lower than the supply temperature, but, for example, the second temperature may be set within a range between 180° C. to 190° C.

The sulfuric acid heated to the second temperature by second heater 42 reaches switching valve 44 as illustrated in FIG. 1. During the circulation mode, switching valve 44 is controlled by control mechanism 60 to block a passage between supply line 41a of second circulation line 41 and first ejection line 51 of ejection mechanism 50. Therefore, the sulfuric acid reached switching valve 44 does not flow into first ejection line 51 of ejection mechanism 50, and flows only in return line 41b of second circulation line 41.

The sulfuric acid contained in second circulation line 41 returns to supply tank 31 of first temperature adjustment mechanism 30 after passing through valve 49 which is opened. Herein, the temperature of the sulfuric acid flowing in second circulation line 41 is decreased to the first temperature or less, or a temperature slightly higher than the first temperature during the sulfuric acid flows in second circulation line 41. Therefore, as described above, the temperature of the sulfuric acid after being mixed with the sulfuric acid returned through first circulation line 33 in supply tank 31 becomes less than at least the first temperature.

Supply Mode

An operation of liquid processing apparatus 10 in the supply mode will be described. Since the operation of first temperature adjustment mechanism 30 in the supply mode is substantially the same as that of first temperature adjustment mechanism 30 in the circulation mode, the description thereof will be omitted. Further, since the operation of valve 48 of second temperature adjustment mechanism 40 in the supply mode is substantially the same as that of second temperature adjustment mechanism 40 in the circulation mode, the description thereof will be omitted.

[Operation of Second Temperature Adjustment Mechanism]

Control mechanism 60 controls second heater 42 to heat sulfuric acid supplied to the second circulation line to temperature equal to or higher than the supply temperature. A specific value of the supply temperature is appropriately set depending on the cleaning property acquired in SPM liquid processing, but, for example, may be set to 200° C. as described above.

As illustrated in FIG. 1, the temperature of sulfuric acid heated by second heater 42 is measured by a temperature sensor 45 installed between second heater 42 and switching valve 45. Information on the measured temperature is transferred from temperature sensor 45 to control mechanism 60.

Control mechanism 60 controls second heater 42 based on the information on the temperature measured by temperature sensor 45. By doing this, it is possible to appropriately control second heater 42 to make the temperature of the sulfuric acid heated by second heater 42 equal to or higher than the above-mentioned supply temperature.

During the operation mode, switching valve 44 is controlled so that a passage between supply line 41a of second circulation line 41 and ejection line 51 is communicated. For instance, driven member 44d of switching valve 44 is moved upward by introducing air into switching valve 44, so that the passage between supply line 41a of second circulation line 41 and ejection line 51 is communicated. As a result, the sulfuric acid heated to a temperature equal to or higher than the supply temperature is supplied to first ejection line 51 from supply line 41a of second temperature adjustment mechanism 40. Valve 49 has been closed during the supply mode.

[Cleaning Processing]

Cleaning processing in which wafer 21 is cleaned using a heated sulfuric acid will be described.

First, liquid processing apparatus 10 is in a circulation mode. That is, the sulfuric acid heated to at least the first temperature is circulating first temperature adjustment mechanism 30 and second temperature adjustment mechanism 40 in first liquid supply mechanism 12 as described above. In this case, cup 70 is moved by elevation mechanism 64 to a position where discharge port 71 and an edge of the outer peripheral end portion of wafer 21 opposes with each other in processing chamber 20 illustrated in FIG. 5, and then, rotation shaft 23 is rotated by rotation mechanism 62 to rotate turn table 24 and wafer 21.

Next, liquid processing apparatus 10 is switched to the supply mode from the circulation mode. Therefore, the sulfuric acid heated to the supply temperature is supplied to ejection mechanism 50. In ejection mechanism 50, the sulfuric acid supplied to first ejection line 51 and the hydrogen peroxide solution supplied to second ejection line 52 are mixed with each other in the vicinity of ejection port 54 of nozzle 53 as illustrated in FIG. 1. As a result, the SPM liquid is produced in the vicinity of ejection port 54. Further, the temperature of the SPM liquid is increased to a third temperature (ejection temperature) higher than the supply temperature due to the heat generated by mixing the sulfuric acid with the hydrogen peroxide solution. For example, when the hydrogen peroxide solution is mixed with the sulfuric acid having a temperature of approximately 200° C. in a predetermined ratio, the SPM liquid having a temperature of approximately 250° C. is obtained.

The High temperature SPM liquid produced as described above is ejected to wafer 21 from ejection port 54. By doing this, an unnecessary resist film on the surface of wafer 21 is removed. Thereafter, the SPM liquid ejected to wafer 21 is discharged through discharge port 71 and discharge flow-path 73. When supplying of the SPM liquid is completed, liquid processing apparatus 10 is switched to the circulation mode from the supply mode.

Next, cup 70 is moved by elevation mechanism 64 to a position where discharge port 72 and the edge of outer peripheral end portion of wafer 21 opposes with each other in processing chamber 20. Thereafter, the rinsing liquid (deionized water) is ejected to wafer 21 from ejection port 54, so that a rinsing processing is performed on the surface of wafer 21. Next, liquid for drying (e.g., IPA) is ejected to wafer 21 from ejection port 57, so that a drying processing is performed on the surface of wafer 21. The rinsing liquid and liquid for drying ejected to wafer 21 are discharged through discharge port 72 and discharge flow-path 74. In this way, the cleaning processing is performed on wafer 21.

Wafer 21 having been subjected to the cleaning processing is carried out through opening (not shown) formed in processing chamber 20, and then, another wafer 21 is carried into processing chamber 20 to be subjected to the cleaning processing. First liquid supply mechanism 12 is controlled to operate in the circulation mode by control mechanism 60 during the sulfuric acid is not supplied to ejection mechanism 50. When wafer 21 is carried into processing chamber 20 to be subjected to the processing using the SPM liquid again, control mechanism 60 controls first liquid supply mechanism 12 to operate in supply mode.

According to the embodiment described above, the sulfuric acid supplied to ejection mechanism 50 is heated to the first temperature first by first temperature adjustment mechanism 30 and then heated to a temperature equal to or higher than the supply temperature by second temperature adjustment mechanism 40. In this way, the sulfuric acid is heated by a two-step heating operation, so that each element disposed at an upstream of second heater 42 among the elements of second temperature adjustment mechanism 40 and each element of first temperature adjustment mechanism 30 are not exposed to a temperature higher than the first temperature. By doing this, it may be designed by assuming that each element disposed at an upstream of second heater 42 among the elements of second temperature adjustment mechanism 40 and each element of first temperature adjustment mechanism 30 needs to have a heat resistance and a chemical resistance resisting the sulfuric acid heated to the first temperature other than the supply temperature.

According to the embodiment, first liquid supply mechanism 12 includes first temperature adjustment mechanism 30 maintaining the sulfuric acid heated to the first temperature, and second temperature adjustment mechanism 40 sandwiched between first temperature adjustment mechanism 30 and ejection mechanism 50. During the circulation mode, second heater 42 is controlled to heat the sulfuric acid to the second temperature which is higher than the first temperature and lower than the supply temperature. Second temperature adjustment mechanism 40 is configured to return the sulfuric acid supplied from first temperature adjustment mechanism 30 thereto. Therefore, even during the sulfuric acid is not being supplied to ejection mechanism 50, second temperature adjustment mechanism 40 can be maintained at a high temperature. For example, it is possible to maintain each element, such as for example, second circulation line 41, second heater 42, switching valve 44, and valves 48 and 49, at a high temperature. Therefore, after first liquid supply mechanism 12 is switched to the supply mode at which the sulfuric acid is supplied from second temperature adjustment mechanism 40 to ejection mechanism 50, the sulfuric acid can be heated rapidly to the supply temperature or more by second heater 42. As a result, after first liquid supply mechanism 12 is switched to the supply mode, it is possible to shorten the time (preheating time) required for the temperature of sulfuric acid heated by second heater 42 to reach the supply temperature or more. Further, a shortened preheating time effect according to the embodiment becomes conspicuous as a heat capacity of each element included in second temperature adjustment mechanism 40 increases gradually.

According to the embodiment described above, switching valve 44 of second temperature adjustment mechanism 40 is configured to allow the sulfuric acid to flow in switching valve 44 during either of the circulation mode or the supply mode. Therefore, switching valve 44 configured to generally have larger heat capacity than other elements can be maintained at high temperature more reliably at all times. By doing this, shortening of the preheating time can be ensured. In addition, it is possible to reduce a temperature difference of switching valve 44 between a case where a passage between supply line 41a and first ejection line 51 is communicated and a case where the passage is not communicated.

According to the embodiment described above, ejection mechanism 50 is configured to allow the sulfuric acid and the hydrogen peroxide solution to be mixed with each other in the vicinity of ejection port 54. Herein, the temperature of the SPM liquid is increased by heat generated by mixing of the sulfuric acid with the hydrogen peroxide solution. By mixing the sulfuric acid with the hydrogen peroxide solution in the vicinity of ejection port 54, the ratio of elements of the ejection mechanism exposed to the SPM liquid, whose temperature is increased to the supply temperature or more, can be reduced. As a result, the heat resistance and the chemical resistance to SPM liquid of which temperature is increased are needed only in the vicinity of ejection port 50, so that the cost of each element of first liquid supply mechanism 12 and second liquid supply mechanism 14 can be reduced.

Various modification and addition can be made with respect to the above-described embodiments. In the following, examples of the modified and additional embodiments will be described.

Figure 7:
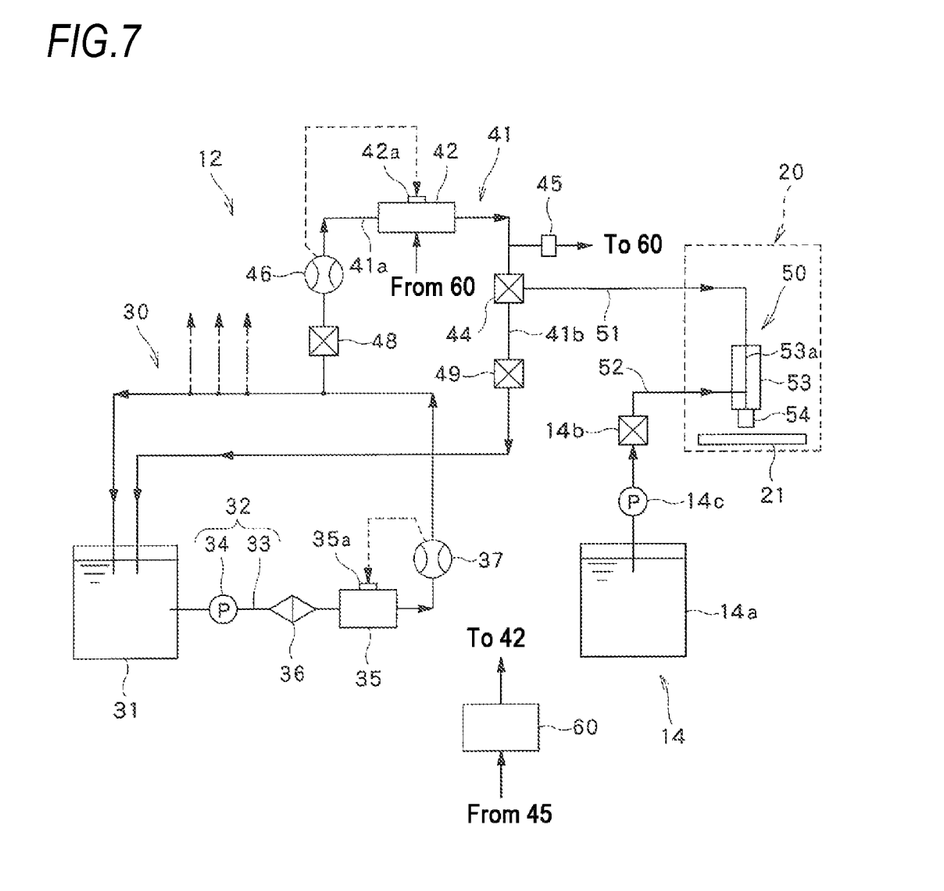
FIG. 7 is a view illustrating an example of a modified liquid processing apparatus.

For instance, as illustrated in FIG. 7, first temperature adjustment mechanism 30 may be further provided with flow rate sensor 37 measuring a flow rate of the sulfuric acid circulating within first circulation line 33, and a stop unit 35a stopping first heater 35 when the flow rate of the sulfuric acid measured by flow rate sensor 37 becomes less than a predetermined lower limit. By doing this, it is possible to prevent an excessive amount of heat as compared with the flow rate of the sulfuric acid from being emitted from first heater 35. As a result, it is possible to prevent the temperature of the sulfuric acid from being excessively increased as well as prevent first heater 35 from being deteriorated due to a so-called idling heat.

In addition, as illustrated in FIG. 7, second temperature adjustment mechanism 40 may be further provided with flow rate sensor 46 measuring a flow rate of the sulfuric acid passing through and circulating in second circulation line 41, and a stop unit 42a stopping second heater 42 when the flow rate of the sulfuric acid measured by flow rate sensor 46 becomes less than a predetermined lower limit of flow rate. By doing this, it is possible to prevent an excessive amount of heat as compared with the flow rate of the sulfuric acid from being emitted from second heater 42. As a result, it is possible to prevent the temperature of the sulfuric acid from being excessively increased as well as prevent second heater 42 from being deteriorated due to a so-called idling heat.

In the modified embodiment illustrated in FIG. 7, stop unit 35a and stop unit 42a are attached to first heater 35 and second heater 42, respectively. However, the elements to which stop units 35a and 42a are attached are not limited thereto, and stop units 35a and 42a may be configured as a part of control mechanism 60. In this case, information on the flow rate of the sulfuric acid obtained by flow rate sensor 37 or 46 is sent to control mechanism 60. Control mechanism 60 may stop first heater 35 or second heater 42 when the flow rate of the sulfuric acid measured by flow rate sensor 37 or flow rate sensor 46 becomes less than a predetermined lower limit of flow rate, respectively.

In the embodiment, an example in which the sulfuric acid maintained at first temperature by first temperature adjustment mechanism 30 is supplied to single second temperature adjustment mechanism 40 illustrated in FIG. 1. However, a mechanism to which the sulfuric acid is supplied from first temperature adjustment mechanism 30 is not limited to second temperature adjustment mechanism 40 illustrated in FIG. 1. That is, as indicated by an alternate long and short dash line in FIG. 1, first temperature adjustment mechanism 30 may supply the sulfuric acid to a plurality of mechanisms except for second temperature adjustment mechanism 40.

In the embodiment, an example in which second heater 42 of second temperature adjustment mechanism 40 is controlled to increase the temperature of the sulfuric acid to the second temperature during the circulation mode is illustrated. However, control of second heater 42 is not limited thereto, and various controls may be performed as long as each element of second temperature adjustment mechanism 40 is maintained at high temperature to some extent during the circulation mode. For example, in a case where the temperature of each element of second temperature adjustment mechanism 40 can be maintained at high temperature only by making the sulfuric acid heated to a first temperature to flow in second circulation line 41 of second temperature adjustment mechanism 40, control mechanism 60 may stop second heater 42 during the circulation mode.

In the embodiment, an example in which second circulation line 41 of second temperature adjustment mechanism 40 is attached to supply tank 31 of first temperature adjustment mechanism 30, but the element to which second circulation line 41 is attached is not limited thereto. Second circulation line 41 of second temperature adjustment mechanism 40 may be attached to other elements of first temperature adjustment mechanism 30 except for supply tank 31. For instance, second circulation line 41 of second temperature adjustment mechanism 40 may be attached to first circulation line 33 of first temperature adjustment mechanism 30.

In the embodiment, an example is illustrated in which a valve serving as switching valve 44 and configured to allow the sulfuric acid to pass through switching valve 44 to flow in second circulation line 41 at all times is utilized. However, the utilization of the valve is not limited to the above-mentioned configuration, but a valve may be utilized serving as switching valve 44 and configured to selectively make either a passage between supply line 41a of second circulation line 41 and first ejection line 51 or a passage between supply line 41a and return line 41b of second circulation line 41 to be communicated. Even in this case, during the circulation mode, the temperature of each element of second temperature adjustment mechanism 40 may be maintained at high temperature by the heated sulfuric acid, so that the above-mentioned preheating time may be shortened.

In the embodiment, a cooling mechanism (not shown) which cools down the sulfuric acid to the temperature equal to or less than the first temperature may be installed in return line 41b of second circulation line 41. By doing this, it is possible to reliably decrease the temperature of the sulfuric acid returning to supply tank 31 through second circulation line 41.

In the embodiment, an example in which nozzle 53 having ejection port 54 is supported by an arm 82 rotatable about a support shaft 81 is illustrated. An element by which nozzle 53 is supported is not limited thereto, and nozzle 53 may be supported to become rectilinearly movable over wafer 21.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A liquid processing apparatus that performs a liquid processing of a substrate using a temperature adjusted liquid, the liquid processing apparatus comprising:
a processing chamber provided with a substrate holder holding a substrate;
an ejection port to eject a first liquid to the substrate held in the substrate holder; and
a first liquid supply mechanism configured to supply the first liquid to the ejection port,
wherein the first liquid supply mechanism includes a first temperature adjustment mechanism configured to maintain the first liquid to a first temperature, a second temperature adjustment mechanism connected to the first temperature adjustment mechanism, and an ejection line configured to connect the second temperature adjustment mechanism with the ejection port, the first temperature adjustment mechanism includes:
a supply tank configured to store the first liquid;
a first circulation line connected to the supply tank to circulate the first liquid;
a first heater installed on the first circulation line and configured to heat the first liquid to a first temperature; and
a pump installed on the first circulation line such that the first liquid is circulated in the first circulation line after being heated to the first temperature by the first heater, the second temperature adjustment mechanism includes:
a second circulation line configured to branch from the first circulation line and return to the supply tank of the first temperature adjustment mechanism wherein the first liquid does not pass through the first circulation line of the first temperature adjustment mechanism;
a second heater installed on the second circulation line and configured to heat the first liquid to a supply temperature higher than the first temperature;
a switching valve provided in the second circulation line and configured to switch between a circulation mode where the first liquid does not flow into the ejection line but flows only in the second circulation line such that the first liquid is not supplied to the ejection port from the second temperature adjustment mechanism of the first liquid supply mechanism and a supply mode where the first liquid is supplied to the ejection port from the second temperature adjustment mechanism of the first liquid supply mechanism through the ejection line communicated with the second circulation line, the ejection line being connected with the second circulation line through the switching valve at a location further downstream than the second heater; and
a controller programmed to control the liquid processing apparatus such that:
in the circulation mode, the second heater of the second temperature adjustment mechanism heats the first liquid to a second temperature that falls between the first temperature and the supply temperature and the first liquid heated to the second temperature by the second heater returns to the supply tank of the first temperature adjustment mechanism through the switching valve and the second circulation line thereby maintaining the first liquid in the second circulation line at the second temperature while the first liquid in the first circulation line is maintained at the first temperature during the circulation mode;
in the supply mode, the second heater of the second temperature adjustment mechanism heats the first liquid from the second temperature to the supply temperature and the first liquid heated to the supply temperature by the second heater is supplied to the ejection port through the switching valve thereby shortening a pre-heating time of the first liquid required for heating the first liquid to the supply temperature while the first liquid heated to the supply temperature is being blocked from returning to the supply tank of the first temperature adjustment mechanism via a downstream side of the switching valve in the supply mode; and
when supplying of the first liquid to the substrate is completed in the supply mode, the switching valve is switched to the circulation mode where the second heater of the second temperature adjustment mechanism heats the first liquid to the second temperature such that the first liquid is circulated in the second circulation line through the switching valve while the temperature of the first liquid is gradually decreased from the supply temperature to the second temperature.

2. The liquid processing apparatus of claim 1, wherein a flow rate of the first liquid returned to the supply tank from the first temperature adjustment mechanism through the first circulation line is larger than that returned to the supply tank from the second temperature adjustment mechanism through the second circulation line.

3. The liquid processing apparatus of claim 1, wherein a plurality of the second temperature adjustment mechanisms are branched from a single first liquid supply mechanism, and each of the second temperature adjustment mechanisms includes an ejection line connected to an ejection port.

4. The liquid processing apparatus of claim 1, wherein when the first liquid is not supplied to the ejection port from the second temperature adjustment mechanism of the first liquid supply mechanism, the second heater of the second temperature adjustment mechanism is stopped.

5. The liquid processing apparatus of claim 1, wherein the second temperature adjustment mechanism includes a flow rate sensor measuring the flow rate of the first liquid and a stop unit stopping the second heater when the flow rate measured by the flow rate sensor becomes less than a predetermined lower limit of the flow rate.

6. The liquid processing apparatus of claim 1, further comprising a second liquid supply mechanism connected between the switching valve and the ejection port to supply a second liquid to the ejection port.

7. The liquid processing apparatus of claim 6, wherein the ejection port is included in an ejection mechanism to allow the ejection mechanism to mix the first liquid supplied from the first liquid supply mechanism with the second liquid supplied from the second liquid supply mechanism and heat the mixed liquid to a third temperature higher than the supply temperature to be ejected toward the substrate.

8. The liquid processing apparatus of claim 1, wherein the second temperature adjustment mechanism further includes an opening/closing valve provided at a downstream side of the switching valve and configured to be opened during the circulation mode and closed during the supply mode.

9. A liquid processing method for performing a liquid processing of a substrate using a temperature adjusted liquid, comprising:
holding a substrate by a substrate holder provided in a processing, chamber;
supplying a first liquid from a first liquid supply mechanism to an ejection port, the first liquid supply mechanism including a first temperature adjustment mechanism having a first circulation line connected to a supply tank for circulating and heating the first liquid to a first temperature by a first heater installed on the first circulation line, a second temperature adjustment mechanism having a second circulation line branching from the first circulation line and returning to the supply tank of the first temperature adjustment mechanism wherein the first liquid does not pass through the first circulation line of the first temperature adjustment mechanism, a second heater installed on the second circulation line to heat the first liquid to a supply temperature higher than the first temperature, and an ejection line connecting the second circulation line with the ejection port through a switching valve;
switching between a circulation mode where the first liquid does not flow into the ejection line but flows only in the second circulation line such that the first liquid is not supplied to the ejection port from the second temperature adjustment mechanism of the first liquid supply mechanism and a supply mode where the first liquid is supplied to the ejection port from the second temperature adjustment mechanism of the first liquid supply mechanism through the ejection line communicated with the second circulation line;
after the first liquid is supplied to the ejection port in the supply mode, ejecting the first liquid to the substrate held in the substrate holder from the ejection port;
controlling such that:
in the circulation mode, heating the first liquid to a second temperature that falls between the first temperature and a supply temperature higher than the first temperature, and circulating and returning the first liquid heated to the second temperature to the supply tank of the first temperature adjustment mechanism through the second circulation line and the switching valve of the second temperature adjustment mechanism, thereby maintaining the first liquid in the second circulation line at the second temperature while the first liquid in the first circulation line is maintained at the first temperature during the circulation mode,
in the supply mode, heating the first liquid from the second temperature to the supply temperature by the second heater and supplying the first liquid heated to the supply temperature to the ejection port through the switching valve and the ejection line thereby shortening a pre-heating time of the first liquid required for heating the first liquid to the supply temperature while the first liquid heated to the supply temperature is being blocked from returning to the supply tank of the first temperature adjustment mechanism via a downstream side of the switching valve,
when supplying of the first liquid to the substrate is completed in the supply mode, switching the switching valve to the circulation mode where the first liquid is heated and maintained at the second temperature such that the first liquid is circulated in the second circulation line through the switching valve while the temperature of the first liquid is gradually decreased from the supply temperature to the second temperature.

10. The liquid processing method of claim 9, wherein a flow rate of the first liquid circulating in the first circulation line of the first temperature adjustment mechanism is larger than that returned to the first temperature adjustment mechanism from the second temperature adjustment mechanism through the second circulation line.

11. The liquid processing method of claim 9, wherein the first liquid flowing on the first temperature adjustment mechanism is supplied to a plurality of the second temperature adjustment mechanisms.

12. The liquid processing method of claim 9, wherein when the first liquid becomes less than a predetermined lower limit of the flow rate, the second temperature adjustment mechanism does not heat the first liquid.

13. The liquid processing method of claim 9, wherein in an ejection mechanism having the ejection port, the first liquid supplied from the first liquid supply mechanism is mixed with a second liquid supplied from a second liquid supply mechanism, and the mixed liquid is heated to a third temperature higher than the supply temperature to be ejected toward the substrate.

14. A non-transitory computer-readable storage medium having stored a program executed by a control mechanism for controlling a liquid processing apparatus therein,
the program, when executed by the control mechanism, controls the liquid processing apparatus to perform a liquid processing method according to claim 9.

* * * * *